United States Patent [19]

Huang et al.

[11] Patent Number: 5,712,078
[45] Date of Patent: Jan. 27, 1998

[54] HIGH CONTRAST PHOTORESISTS COMPRISING ACID SENSITIVE CROSSLINKED POLYMERIC RESINS

[75] Inventors: Wu-Song Huang, Poughkeepsie, N.Y.; Harold George Linde, Richmond; Charles Arthur Whiting, Milton, both of Vt.

[73] Assignee: International Business Machines Corporation, Armonk, N.Y.

[21] Appl. No.: 476,793

[22] Filed: Jun. 7, 1995

Related U.S. Application Data

[63] Continuation-in-part of Ser. No. 71,095, Jun. 4, 1993, abandoned.

[51] Int. Cl.$^6$ ............................................. G03C 1/73
[52] U.S. Cl. ...................... 430/270.1; 430/326; 430/905; 522/78
[58] Field of Search .................. 430/270.1, 326, 430/905; 522/78

[56] References Cited

U.S. PATENT DOCUMENTS

| | | | |
|---|---|---|---|
| 3,376,136 | 4/1968 | Seide | 96/28 |
| 3,676,145 | 7/1972 | Protzman | 96/115 |
| 3,779,778 | 12/1973 | Smith et al. | 96/115 R |
| 4,102,687 | 7/1978 | Crivello | 96/115 R |
| 4,247,611 | 1/1981 | Sander et al. | 430/286 |
| 4,371,605 | 2/1983 | Renner | 430/280 |
| 4,407,928 | 10/1983 | Vanier | 430/214 |
| 4,491,628 | 1/1985 | Ito et al. | 430/176 |
| 4,737,426 | 4/1988 | Roth | 430/17 |
| 4,946,759 | 8/1990 | Doessel et al. | 430/270 |
| 4,946,760 | 8/1990 | Elsaesser | 430/270 |
| 4,962,171 | 10/1990 | Osuch et al. | 526/266 |
| 5,081,001 | 1/1992 | Osuch et al. | 430/296 |
| 5,128,232 | 7/1992 | Thackeray et al. | 430/192 |
| 5,200,291 | 4/1993 | Wanat | 430/163 |
| 5,200,529 | 4/1993 | Osuch et al. | 548/517 |
| 5,210,003 | 5/1993 | Schadeli | 430/270 |
| 5,212,047 | 5/1993 | Hertler et al. | 430/270 |
| 5,262,270 | 11/1993 | Walls | 430/156 |
| 5,302,488 | 4/1994 | Roseschert et al. | 430/190 |
| 5,468,589 | 11/1995 | Urano et al. | 430/326 |

FOREIGN PATENT DOCUMENTS

| | | | |
|---|---|---|---|
| 0361907 | 9/1989 | European Pat. Off. | G03F 7/004 |
| 0520642 | 6/1992 | European Pat. Off. | G03F 7/039 |
| 02248953 | 3/1989 | Japan | |
| 3-282550 | 12/1991 | Japan | |
| 4-51243 | 2/1992 | Japan | |

OTHER PUBLICATIONS

Y. Jiang, et al., *Polymeric Materials Science And Engineering*, "Chemically Amplified Deep UV Photoresists Based on Acetal-Protected Poly(Vinylphenols)", 66, 41–43 (1992).

N. Hayashi, et al., *Polymeric Materials Science And Engineering*, "Tetrahydropyranyl and Tetrahydrofuranyl Protected Polyhydroxy-styrenes in Chemical Amplification Resist Systems for KrF Excimer Laser Lithography", 61, 417–421 (198).

N. Hayashi, et al., *SPIE Advances In Resist Technol. & Process VIII*, "Polyvinylphenols Protected With Tetrahydropyranyl Group in Chemical Amplification Positive Deep UV Resist Systems", 1466, 377–383 (1991).

S. Hesp, et al., *Journal Of Applied Polymer Science*, "Tetrahydropyranyl-and Furanyl-Protected Polyhydroxystyrene in Chemical Amplification Systems", 42, 877–883 (1991).

M. Shirai, et al., *Journal Of Polymer Science*, "Synthesis and Photo-Induced Dissolution of Polymers Bearing Imino Sulfonate Groups", 27, 325–332 (1989).

*Primary Examiner*—George F. Lesmes
*Assistant Examiner*—Laura Weiner
*Attorney, Agent, or Firm*—Heslin & Rothenberg, P.C.

[57] ABSTRACT

Acid sensitive polymeric compositions, and improved chemically amplified microlithographic resist compositions comprising the acid sensitive polymeric compositions, and methods for the preparation and use thereof are disclosed. The compositions comprise, in admixture, a polymeric binder, an acid labile moiety which provides selective aqueous base solubility upon cleavage, and a compound that generates acid upon exposure of the resist composition to imaging radiation. More particularly, the compositions have one or more acid labile ketal groups, which may be chemically linked to a polymeric resin or which may be incorporated into a separate component to form a dissolution inhibitor. Crosslinking of the polymer to produce a high molecular weight, nonpolar resin may also occur by ketal exchange. Upon exposure, molecular weight and polarity changes of the crosslinked resin produce high contrast during development. The compositions exhibit reduced sensitivity to environmental contaminants when compared to known acid amplified resist compositions, and may optionally be processed without a post exposure bake step. Such compositions are especially useful in the fabrication of integrated circuit devices by microlithographic techniques.

8 Claims, No Drawings

HIGH CONTRAST PHOTORESISTS COMPRISING ACID SENSITIVE CROSSLINKED POLYMERIC RESINS

CROSS REFERENCE TO RELATED APPLICATION

This application is a continuation-in-part of the earlier, application Ser. No. 08/071,095 filed Jun. 4, 1993; now abandoned, by Brunsvold et al.

FIELD OF THE INVENTION

The present invention provides improved chemically amplified microlithographic resist compositions, polymeric components which are useful therein, and methods for the preparation and use thereof. The compositions comprise, in admixture, a compound that generates acid upon exposure of the resist composition to imaging radiation, a polymeric binder, and, either in admixture with the binder or chemically linked thereto, an acid labile moiety which provides selective aqueous base solubility of the mixture upon cleavage. The invention is particularly related to compositions having an acid labile moiety comprising a ketal functional group. Such compositions are especially useful in the fabrication of integrated circuit devices by microlithographic techniques.

BACKGROUND OF THE INVENTION

In the fabrication of high density integrated circuits having sub micron dimensions, the coating, exposure, and development of a photoresist layer are particularly critical processing steps, and must be accomplished within close processing tolerances. For example, it is important to control the linewidth of the imaged and developed photoresist so that any deviation from the nominal design linewidth is small, typically less than ±10%. The profiles of the imaged and developed photoresist structures must be straight with vertical sidewalls. Photospeed must be such that the required exposure dose is less than about 100 mJ/cm$^2$ and preferably less than about 25 mJ/cm$^2$. Moreover, and in part because the exposure of individual substrates is typically accomplished in a serial manner, whereas development is typically accomplished in a batch manner, it is desirable to use photoresists which are tolerant of a variable time delay between the exposure and development steps, and also between each of any intervening steps. In sub micron lithography, the use of acid amplified resists has become favored due to the high photospeed of such compositions.

The use of acid amplified resist compositions is well known in the art. Such resist compositions are especially useful in conjunction with deep UV (180-300 nm), e-beam, and X-ray exposure tools, in light of their high photospeed characteristics. The following references illustrate the state of the pertinent art.

U.S. Pat. No. 3,779,778 to Smith, et al., discloses photo-solubilizable compositions comprising a water insoluble compound having acid labile groups and a photosensitive acid progenitor. Acid labile groups which are disclosed include acetal groups.

U.S. Pat. No. 4,491,628 to Ito, et al., discloses chemically amplified photoresist compositions comprising a photosensitive acid progenitor and a polymeric component having acid labile groups pendent therefrom, wherein the acid labile groups are tert-butyloxycarbonyloxy groups.

U.S. Pat. No. 4,946,759 to Doessel, et al., discloses a positive tone, radiation sensitive composition comprising a photosensitive acid generator, and an acid cleavable compound which may be a carboxamide acetal or a polymeric compound having recurrent acetal groups in polymer main chain.

U.S. Pat. No. 4,946,760 to Elsaesser discloses a radiation sensitive composition comprising a photosensitive acid generator, and an acid cleavable compound which may be a polymeric compound having recurrent acetal groups in polymer main chain.

European Application EP 0 520 642 A discloses a resist composition comprising a photosensitive acid progenitor and a polymeric component having acid labile groups pendent therefrom, wherein the acid labile groups are acetal or ketal groups.

Japanese Patent Kokai No. 02-248,953 (1990) discloses a three component photosensitive composition comprising an alkali soluble polymeric resin, a photosensitive acid generator, and an acid cleavable tetrahydropyranyl substituted phenol.

Jiang and Bassett have described the preparation and use of chemically amplified deep UV photoresists comprising a photosensitive acid generator and a polymeric component having acid labile acetal groups pendent therefrom. Y. Jiang and D. Bassett, Chemically Amplified Deep UV Photoresists Based On Acetal-Protected Poly(vinylphenols), Proc. Amer. Chem. Soc., Div. Polym. Mater. Sci. Eng., 66, 41 (1992).

Hayashi, et al., have previously described the preparation and use of chemically amplified deep UV photoresists comprising a photosensitive acid generator and acetal substituted poly(hydroxystyrenes). Hayashi, et al., Tetrahydropyranyl and Tetrahydrofuranyl Protected Polyhydroxystyrenes in Chemical Amplification Resist Systems for KrF Excimer Laser Lithography, Proc. Amer. Chem. Soc., Div. Polym. Mater. Sci. Eng., 61, 417, (1989); Hayashi, et al., Polyvinylphenols Protected With Tetrahydropyranyl Group in Chemical Amplification Positive Deep UV Resist Systems, SPIE, Adv. Resist Technol. and Process, VIII, 1466, 377, (1991); S. Hesp, N. Hayashi, and T. Ueno, Tetrahydropyranyl and Tetrahydrofuranyl Protected Polyhydroxystyrene in Chemical Amplification Systems, J. Appl. Polym. Sci., 42, 877, (1991).

Although chemically amplified photoresist compositions are favored for sub micron lithography, those chemically amplified photoresists which are based on tert-butyl ethers, esters, and carbonates are particularly sensitive to environmental contaminants and thus often require a overlaying top coat as a protective barrier layer. Furthermore, such compositions are not tolerant of variable or lengthy delays between exposure and the post exposure bake (PEB) required for such compositions, as the photogenerated acid species may diffuse from the exposed region of the resist or may be consumed by adverse contact reactions.

Chemically amplified photoresist compositions based on acid labile groups comprising acetals often give rise to unpredictable results. In particular, photoresist components comprising an acetal moiety designed to produce a hydroxylic moiety imparting base solubility to the resist typically yield aldehydes upon acid catalyzed cleavage or hydrolysis. In turn, such aldehyde species may lead to resist crosslinking by means of aldol condensation reactions under the influence of heat or radiant energy from the exposing radiation source. Thus, many such acetal based resists unpredictably demonstrate both positive tone and negative tone behaviors. Furthermore, known photoresist compositions based on acetal acid labile groups exhibit a cleavage reaction rate of some nominal value in the exposed regions even at ambient temperature, which reaction rate is accelerated during a PEB step. The cleavage reaction may also continue at a slow rate following PEB and prior to development. If such compositions are processed without the use of a PEB, competing contact reactions or reactions with environmental contaminants slow and interrupt the cleavage reaction prior to completion of acetal cleavage sufficient to render the composition differentially soluble, thus acceptable relief images can not be obtained. If such compositions are processed with the use of a PEB, the degree of completion of the cleavage reaction varies highly depending upon the variation in delay time between the exposure step and the PEB step, and also depending upon the remaining, unconsumed acid present in the resist at the commencement of the PEB step. For these reasons, the results are unpredictable. Thus, there is a need for improved chemically amplified photoresist compositions which are not subject to adverse reactions with environmental contaminants and which are tolerant of variable or lengthy delays between exposure and the post exposure bake step, if any, or between the PEB step and development.

SUMMARY OF THE INVENTION

According to the invention, improved chemically amplified microlithographic resist compositions, polymeric components which are useful therein, and methods for the preparation and use thereof are disclosed. The compositions comprise, in admixture, a polymeric binder, an acid labile moiety which provides selective aqueous base solubility upon cleavage, and a compound that generates acid upon exposure of the resist composition to imaging radiation. More particularly, the compositions have one or more acid labile ketal groups, which may be chemically linked to a polymeric resin or which may be incorporated into a separate component to form a dissolution inhibitor. The compositions exhibit reduced sensitivity to environmental contaminants when compared to known acid amplified resist compositions, may be processed without a post exposure bake step, and have equivalent or better photospeed than known compositions.

In addition, crosslinking of the polymer occurs by ketal exchange if the concentration of the acid labile ketal compound in the mixture is great enough and/or if the temperature of the reaction is increased to about room temperature. This reaction is also termed transetherification. A nonpolar, high molecular weight resin is thereby produced. Upon exposure, cleavage of the resist resin occurs to form a material having both increased polarity and decreased molecular weight. Thus, high contrast images having sharp sidewalls are produced during development. Also, at increased temperatures, crosslinking increases, and the resin remains thermally stable at temperatures up to about 120° C. Thus, higher post apply bake processes may be used without degradation of the resist resin, and film thinning during development is reduced.

DETAILED DESCRIPTION OF THE PREFERRED EMBODIMENTS

The present invention provides novel compositions which are improved chemically amplified microlithographic resists. The compositions comprise, in admixture, a compound that generates acid upon exposure of the resist composition to imaging radiation, a polymeric binder, and, either in admixture with the binder or chemically linked thereto, an acid labile moiety which provides selective aqueous base solubility of the mixture upon cleavage. The invention is particularly related to compositions having an acid labile moiety comprising a ketal functional group. The compositions are useful in conjunction with lithographic exposure systems using any of electron beam, ion beam, ultraviolet, or x-ray radiation. As used herein, the terms "imaging radiation", "actinic radiation" and "radiation" are interchangeable and are used to refer to, but are not limited to, the aforementioned forms or sources of radiant energy. The artisan will appreciate that other radiation sources known in the art will also be useful. The compositions are particularly suitable for patternwise exposure with deep UV radiation. Deep UV is considered to be ultraviolet light having a wavelength in the range from about 180 nm to about 300 nm.

The compositions of the invention are said to be chemically amplified. By this is meant that one photon or energetic particle is absorbed by the acid generator which produces one acid molecule that subsequently can cause up to about a thousand chemical events, or individual cleavage reactions of the acid labile groups, to take place. The acidic moiety acts as a catalyst, because the acid is regenerated after each of many individual reactions. The generation of acid from the radiation sensitive acid generator does not require heat, however, most known chemically amplified resists require a post-exposure bake (PEB) of one to two minutes in length to complete the reaction between the acid moiety and the acid labile component. During this time, acid diffusion in the film can cause an undesirable effect if acid moieties migrate into unexposed regions or are consumed by contaminants prior to reacting with the acid labile component. However, it is particularly noted that the compositions of the present invention undergo facile acid catalyzed cleavage of the ketal group at room temperature, and thus, optionally do not require a PEB step in processing. This is decidedly advantageous in controlling image size and quality.

The compositions of the invention are particularly useful for microlithography in that image size is not particularly sensitive to changes in post-exposure bake temperature or delay time. A change of less than about ±2 nm in feature size per change in °C. of PEB temperature is observed in printing images. Additionally, a change of less than about ±10% in feature size having a nominal line width of 0.35 µm was observed between substrates exposed to deep UV with a 0.37NA lens, processed with minimal delay time between exposure and PEB temperature and those substrates processed with a 24 hour delay time in ambient condition storage. Furthermore, the compositions of the invention are not sensitive to the deleterious effects of environmental contaminants, such as air-borne vapors of organic bases, NMP vapor, and the volatile products of common materials present in a fabrication facility such as paints, glues, and caulking materials. This is especially useful in state-of-the-art semiconductor manufacturing where printing sub-micron images necessitates a tight linewidth tolerance with respect to the target dimension. In a manufacturing process, the linewidth tolerance is usually about ±10% of the nominal dimension.

The present invention is directed to compositions in which the acid labile group is a ketal group. The acid labile compound comprising a ketal moiety may be chemically linked to a component of the resist composition which functions as a dissolution inhibitor and is in physical admixture with a film forming polymer having recurrent hydroxyl groups and further in admixture with a radiation sesensitive acid generating compound. In alternative embodiments, the acid labile group comprising a ketal moiety may be chemically linked to the film forming polymer by means of the ketal group wherein one or more of the ketal oxygens is derived from a polymeric hydroxyl group. Such polymeric species may be prepared by the chemical reaction between film forming polymers having recurrent hydroxyl groups and ketal progenitors including, without limitation, substituted vinyl ethers, and orthoesters. Such polymeric species may also be prepared by the transetherification reaction between a ketal and a polymer having recurrent hydroxyl groups chemically linked thereto. Where the ketal moiety is incorporated by chemical reaction with one or more of the recurrent hydroxyl groups, the hydroxyl groups of the polymeric product may be partially or fully substituted. The degree of substitution may be in the range from about 5 to about 100%.

In addition, when the level of polymeric O-substitution is approximately 25% or greater, due to a high concentration of the acid labile compound in the admixture, crosslinking of the polymer by ketal exchange with the acid labile compound may also occur. At lower ketal substitution levels, crosslinking may begin by increasing the reaction temperature. In either case, crosslinking increases as the reaction temperature is raised. A high molecular weight composition which is nonpolar and insoluble in base solution results.

The present invention also contemplates additional, alternative embodiments wherein the ketal moiety is chemically linked to a suitable host polymer having recurrent hydroxyl groups, and wherein the chemical linkage does not contain one of the said recurrent hydroxyl groups. The skilled artisan will appreciate that where the appropriate solubility properties are achieved, the ketal moieties may, for example, be chemically linked to, and dependent from, the polymer backbone, but separate from the recurrent hydroxyl groups. Similarly, the ketal moiety may, for example, comprise a portion of the polymer chain. Furthermore, in additional, alternative embodiments the ketal moiety may be chemically linked to alternative functional groups, including without limitation, carboxylates, sulfonamides, and other functional groups known in the art. Finally, in yet another alternative embodiment contemplated by the present invention, the ketal moiety may be chemically linked to the acid generating compound. The foregoing contemplated embodiments are intended to be merely illustrative of alternative embodiments within the scope of the invention and not to be limiting thereto.

The acid labile compounds comprising a ketal moiety which are useful in the present invention may be further characterized as imparting the property of differential solubility to the exposed, as compared to the unexposed, areas of a resist film formed from the compositions of the invention. By differential solubility is meant those portions of the film which have been exposed to imaging radiation become selectively soluble in aqueous base developers, whereas those portions of the resist compositions which have not been exposed to imaging radiation remain relatively less soluble in the aqueous base developers. The artisan will appreciate that the presence of the ketal moiety renders a portion of the film relatively less soluble in developer, and that the absence of the ketal moiety, or the cleavage products thereof, render a portion of the film relatively more soluble in developer.

Additionally, the acid labile compounds comprising a ketal moiety which are useful in the present invention may be characterized as having sufficient reactivity towards the acid derived from the acid generating compound so as to result in the cleavage of at least a portion of the ketal groups upon exposure to such acid.

Furthermore, the acid labile compounds comprising a ketal moiety which are useful in the present invention may be additionally characterized as being soluble in a coating solvent.

Examples of acid labile compounds comprising a ketal moiety which are useful in the present invention include, without limitation, polymers comprising a ketal group, substituted and unsubstituted ketal compounds and substituted and unsubstituted functional groups comprising a ketal and having less than about 40 carbons, provided however, that such polymers, compounds, and functional groups have the requisite reactivity with acids and solubility properties.

Examples of preferred acid labile compounds comprising a ketal moiety include compounds having the form

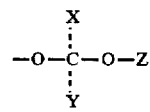

wherein X, Y, and Z, are selected, independently, from the group consisting of non-bridging alkyl, aryl, alicyclic, and O-heterocyclic groups, and bridging groups comprising 2 to 8 carbons between any two of X, Y, and Z. Examples of more preferred acid labile compounds comprising a ketal moiety include compounds wherein the ketal moiety is selected from the group consisting of 2-(2-methyl-tetrahydrofuranyl)oxy, 2-(2-methyl-tetrahydropyranyl)oxy, 1-(1-methoxycyclohexyl)oxy, 2-(2-methoxypropyl)oxy, 4-(4-methoxy-tetrahydropyranyl)oxy, and (1-phenoxy-1-phenylethyl)oxy.

An example of a most preferred acid labile compound comprising a ketal moiety is a compound comprising the 2-(2-methoxypropyl)oxy group.

The polymeric binders which are useful in the present invention include film forming polymers having recurrent hydroxyl groups chemically linked thereto and derivatives thereof. Polymeric binders which are useful in alternative embodiments are film forming polymers having recurrent hydroxyl groups chemically linked thereto and derivatives thereof wherein at least a portion of the film forming polymer hydroxyl groups are O-substituted with an acid labile compound comprising a ketal moiety. The degree of O-substitution may be in the range from about 5 to about 100%. When the degree of O-substitution is about 25%, due to a high concentration of the acid labile compound in the admixture, crosslinking of the polymer by ketal exchange with the acid labile compound may occur to produce a nonpolar, high molecular weight composition. At lower ketal substitution levels, crosslinking may begin by increasing the reaction temperature. In addition, crosslinking increases with increasing temperature. Polymeric binders which are useful in additional alternative embodiments are film forming polymers having recurrent hydroxyl groups chemically linked thereto and derivatives thereof which polymers further comprise an acid labile compound comprising a ketal moiety.

The polymeric binders which are useful in the present invention are further characterized as imparting the property of differential solubility as previously described above. That is, the polymeric compositions are selected so that those portions of the resist compositions which have been exposed to imaging radiation become selectively soluble in aqueous base developers, whereas those portions of the resist compositions which have not been exposed to imaging radiation remain relatively less soluble in the aqueous base developers. Factors contributing to the increased solubility of the exposed crosslinked polymeric binders of the present invention include not only increased polarity of the composition upon radiation, but also decreased molecular weight (size) due to the cleavage of the couplings.

Examples of preferred polymers include hydroxyaromatic polymers which are the condensation reaction product of a substituted or unsubstituted phenol with an aldehyde. By hydroxyaromatic polymers is meant those polymeric compositions comprising a substituted or unsubstituted phenol, naphthol, or congeneric groups having a hydroxyl group directly bonded to an aromatic ring, wherein the aromatic ring may be pendent from the polymeric backbone or may be in the polymeric chain. Preferred polymers also include polymers or copolymers derived from a substituted or unsubstituted hydroxystyrene, by which is meant that the polymers or copolymers have an aliphatic or partially aliphatic polymer backbone and have hydroxyaromatic groups pendent therefrom. Examples of more preferred polymers include novolak resins, and polymers which are the condensation reaction product of formaldehyde with phenol or an alkylphenol, and polyhydroxystyrene.

In an alternate embodiment, the polymer may be a copolymer derived from a substituted or unsubstituted hydroxystyrene and an olefinically substituted cyclic alcohol. In an alternate preferred embodiment, the polymer may be poly (hydroxystyrene-co-vinyl cyclohexanol) which is described in U.S. Pat. No. 5,128,232 to Thackeray, the disclosure of which is incorporated herein by reference. The poly (hydroxystyrene-co-vinyl cyclohexanol) has the form

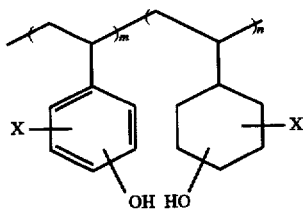

where X is, independently, a hydrogen or an alkyl group having 1 to 8 carbons, and m is in the range of about 0.8 to 1, and n is in the range of about 0 to 0.2.

The radiation sensitive acid generating compounds which are useful in the present invention include, without limitation, metallic, metalloid, and non-metallic onium salts of which examples are described in U.S. Pat. No. 4,102,687, aryl sulfonates including without limitation, tris-pyrogallol sulfonates and anthracene-2-sulfonates such as 9,10-diethylanthracene-2-sulfonate, 2-nitrobenzyl esters, beta-ketosulfones, disulfones, arylsulfonyl-alpha-keto- and alpha-carboxyl- diazomethanes, and precursors of substituted and unsubstituted sulfonic acids, including, without limitation, oxime sulfonates as described in EP 0 361 907 to Hoechst Celanese Corporation, and in the publication of Shirai, et al., "Synthesis and Photo-Induced Dissolution of Polymers Bearing Imino Sulfonate Groups," J. Polym. Sci. A, 27, 325 (1989), and N-hydroxyimides of the type described in U.S. Pat. No. 4,371,605. Preferred radiation sensitive acid generators include the acid progenitors described in copending U.S. patent application Ser. No. 07/968,120 filed Oct. 29, 1992, entitled "Chemically Amplified Photoresists Comprising Non-Metallic Photosensitive Acid Generators" (attorney docket number FI9-88-046X) the disclosure of which is incorporated herein by reference. Examples of preferred radiation sensitive acid generators disclosed in the cited application include N-(trifluoromethylsulfonyloxy)-bicyclo-[2.2.1]hept-5-ene-2,3-dicarboximide (MDT), N-(trifluoromethylsulfonyloxy)-nitronaphthalimides, N-(trifluoromethylsulfonyloxy)-4-halonaphthalimides, N,N'-bis(camphorsulfonyloxy)-3,4,9,10-perylenetetracarbox-diimide, N-(trifluoromethylsulfonyloxy)-7-oxabicyclo-[2.2.1]hept-5-ene-2,3-dicarboximide, N-(trifluoromethylsulfonyloxy)-succinimide, N,N,'-bis-(trifluoromethylsulfonyloxy)-(3-methyl-4,5-i mido-cyclohex-3-enyl)-succinimide,N-(trifluoromethyls ulfonyloxy)-diphenylmaleimide, di-[N-(trifluoromethylsulfonyloxy)-phthalimidyl]ether, bistrifluoromethyl-bis-N,N-(trifluoromethYlsul fonyloxy)-phthalimidylmethane,N-(camphorsulfonyloxy)-naphthalimide,N-(camphorsulfonyloxy)-nitronaphthalimi des, and the corresponding tosyl-, brosyl-, fluoro-and perfluoro-benzenesulfonyloxy-, nitrobenzenesulfonyloxy-, and halobenzenesulfonyloxy-analogs thereof. The practitioner will understand that other radiation sensitive acid generators which are known in the art are anticipated to be useful.

In alternative embodiments, other radiation sensitive acid generating compounds which are useful in the present invention include 2-diazo-1-naphthoquinone-4-sulfonic acid esters, 2-diazo-1-naphthoquinone-5-sulfonic acid esters, and mixtures and combinations thereof. It is particularly noted, however, that compositions comprising a 2-diazo-1-naphthoquinone-5-sulfonic acid ester as an acid generating species typically require a post exposure bake step during lithographic processing.

In additional alternative embodiments, other radiation sensitive acid generating compounds which are useful in the present invention include polymerically bound radiation sensitive acid generators including polymers having hydroxyl groups wherein at least a portion of the hydroxyl groups are O-substituted with substituted or unsubstituted diazoacetoacetate ester groups. In an additional alternative embodiment, the acid generator may be a polymerically bound bis-keto diazomethane.

The polymeric compositions of the present invention may be dissolved in various solvents to provide a composition which is useful for forming thin films. Solvents may be esters, ethers, ketones, alcohols or other resist solvents known in the art. Particular examples of solvents include, without limitation, alkoxy alkanols such as methoxypropanol, Γ-butyrolactone, ethyl lactate, acetate and propionate esters, tetrahydrofurfural alcohol, or combinations thereof. The preferred solvents are acetate esters and ethyl lactate.

Typical liquid photoresist compositions will have up to about 50% solids. In embodiments wherein the acid labile moiety is a separate component from the polymeric binder component, the typical proportion of acid labile component to binder may be in the range from about 10:90 to about 40:60. In embodiments wherein the acid labile moiety is chemically linked by means of O-substitution to at least a portion of the film forming polymer hydroxyl groups, the degree of substitution of hydroxyl groups may be in the range from about 5 to about 100%. In such embodiments the typical proportion of acid generator to acid labile moiety may be in the range from about 0.1:99.9 to about 30:70.

When the degree of O-substitution of hydroxyl groups with the acid labile ketal moiety is at least about 15%, and preferably about 25%, crosslinking of the film forming polymer by ketal substitution also occurs. One of the ketal oxygens is derived from the hydroxyl group of one polymeric chain, and the second is derived from the hydroxyl group of a second chain. Preferably, the polymeric hydroxyl groups are phenolic, and the ketal exchange results in the formation of a diaryl ketal polymer resin.

In the preferred embodiment, the polymer is a polyhydroxystyrene (PHOST or PHS) chain, and the acid labile ketal compound is methoxypropene (MOP).

Initially, upon mixing, simple addition occurs between PHOST and MOP, and the reaction is illustrated by the following scheme:

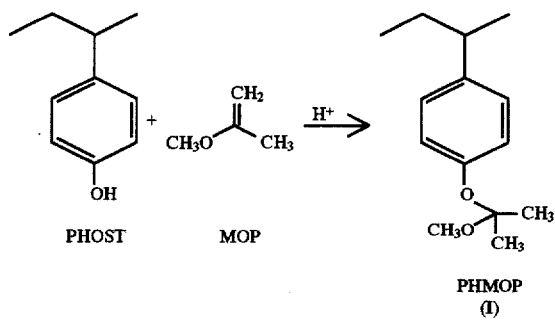

The resulting O-substituted polymer (I) (PHMOP) is nonpolar. A resist formed from polymer (I) and exposed to actinic radiation will exhibit increased polarity due catalytic acid deprotection, and the deprotected composition will be base soluble. During development with a base, contrast between the exposed portion and the unexposed portion of the resist is created. In general, the quality of image contrast in chemically amplified resists depends on the increased developer solubility of the exposed resist with respect to the unexposed resist, a factor that relies upon an increase or decrease in either the polarity or the molecular weight (size) of the exposed resist.

When the initial MOP concentration and/or reaction temperature is high enough, an additional crosslinking reaction occurs in which a substantial fraction (>⅓) of the polymeric material couples). In the crosslinking reaction, ketal exchange occurs between the methoxy ketal group and a phenolic hydroxy group from a second polymeric chain thereby coupling polymer chains and eliminating methanol. The crosslinking reaction is shown by the following scheme:

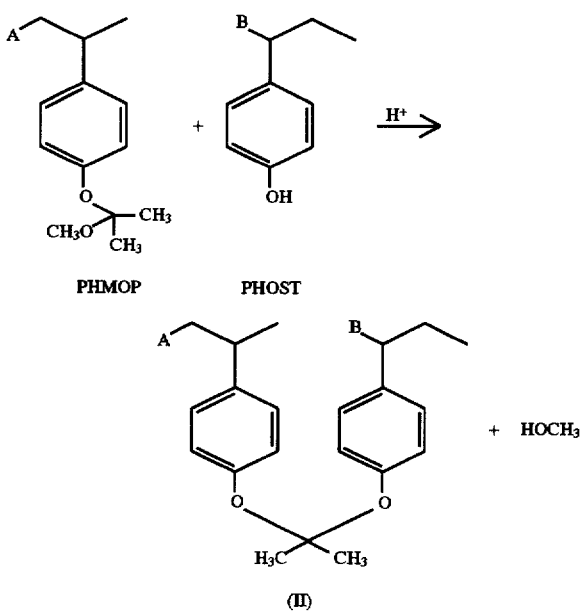

The resulting polymeric resin (II) has a higher molecular weight and is more nonpolar relative to the film forming polymer. Upon exposure of a resist formed therewith, cleavage and deprotection of the polymeric resin (II) occurs to decrease the molecular weight and increase the polarity. The exposed resist is thus very soluble in base solution creating very high image contrast during development with a base. Significant improvement in contrast can be seen where the amount of crosslinked polymer is greater than about 33% as indicated by GPC. It should be noted that the "amount of crosslinked polymer" does not represent the number of crosslinking sites but represents the % of the polymer as a whole that is crosslinked. The crosslinked polymers as measured by GPC are polymers having one or more crosslinking sites.

The above crosslinking reaction depends on two factors: 1) the concentration of the acid labile compound; and 2) the temperature of the reaction. Generally, a molar excess of the acid labile ketal compound (MOP) is sufficient, and O-substitution of at least about 25% of the film forming polymer (PHOST), as measured by NMR, is preferred to produce a suitable crosslinked resin. As used herein, the term "molar excess" refers to the percentage excess of one reactant over the other on a molar basis. The relative contrast quality improves with increased crosslinking, and sufficient crosslinking providing good contrast is obtained with hydroxyl substitutions preferably between about 25%–50%, with between about 35%–50% being the most preferred. If, due to a low concentration of the MOP, the degree of O-substitution is below 25%, e.g. about 15%, then a lesser amount of crosslinking will take place, and while the resulting resin will still be useful, the relative quality of the contrast will be poorer.

Independent of MOP concentration in the reaction mixture, the amount of crosslinking also depends on the magnitude of the reaction temperature. For example, with low amounts of MOP, if the reaction is conducted at about 0° C., for example, only simple substitution of the phenolic hydroxyl groups with the ketal compound will occur. At higher reaction temperatures, crosslinking may also occur if the degree of MOP substitution of the PHOST is at least about 15%. Upon heating either mixture (high or low MOP concentration) to about room temperature, or up to about 40° C., the crosslinking reaction will proceed further toward completion, and the amount of polymeric resin (II) produced will increase. Generally, good contrast is obtained from a resist made from a polymeric resin (II) wherein about 33% of the material is crosslinked, as measured by GPC. Reaction temperatures between about –40° C. and about 40° C. are generally used, and room temperature (20° C.) to about 40° C. is preferred. A combination of temperatures may also be used. For example, where there is an excess of MOP, the reaction may be run at an initial temperature of between about –40° C. and about 10° C. for a time sufficient to cause O-substitution of the recurrent hydroxyl groups with the acid labile compound and crosslinking, then increased to a second temperature between about 10° C. and about 40° C. for a second time to increase the crosslinking.

Crosslinking continues until the acid is quenched upon completion of the initial addition reaction, thus, preventing severe gelation. Generally, reaction times of between about 10 minutes to about 3 hours are sufficient to obtain significant crosslinking (about 33% of polymer), depending on the reaction temperature and on the concentration of MOP. Preferably, where there is about 25% O-substitution, the reaction should be run between about 10°–30° C. for about one hour.

Prior to exposure, the resist produced from the high molecular weight resin (II) or the methoxy ketal polymer (I) is generally spin-coated onto a silicon wafer and may be baked (post apply bake (PAB)) at temperatures between about 90° C. and about 120° C. High bake temperatures, such as 120° C., deplete the methoxy ketal protecting groups of the acid labile compound creating unacceptable film thinning during development. However, the diaryl ketal group of the resin (II) is thermally stable to at least 120° C. during the post apply bake process, and crosslinking continues at this temperature. Thus, if the high molecular weight resin (II) having significant polymeric crosslinking (about 33%) is used to produce the resist, then decomposition at PAB temperatures will not occur, and surface thinning on the wafer will be reduced during development.

Exposure to actinic radiation produces the catalytic strong acid which simultaneously hydrolyzes a portion of the methoxy ketal as well as a portion of the diaryl ketal produced during the ketal exchange crosslinking reaction. During these deprotection and chain cleavage reactions, both the molecular weight (size) of the resist is reduced, and the resist polarity is increased. The exposed portions of the resist become very soluble in base developing solution while the unexposed portions remain very insoluble. Thus, high contrast with a very sharp sidewall is exhibited upon development. Because both changes in molecular weight and polarity of the high molecular weight composition occur during exposure, the exposed resist is significantly more soluble in base. Thus, an improvement in the contrast quality is realized with respect to resists in which only the polarity increases upon exposure, such as those formed from PHMOP where only the acid labile compound (MOP) is added to the film forming polymer (PHOST).

In addition to the improved contrast quality during development, use of the high molecular weight ketal resin in the synthesis of chemical amplified resists offers other potential advantages over the MOP addition product. Its higher molecular weight discourages film thinning during development in unexposed areas. Further, because the crosslinking group is labile in exposed, acid-rich areas, polymer dissolution into lower molecular weight species in these exposed areas is not inhibited. The higher molecular weight species (II) has certain advantages over the methoxy ketal polymer (I), and a balance of both functional group types can be adjusted for best lithographic control.

In yet another alternative embodiment, traces of a surfactant may also be added to the resist compositions.

In yet another alternative embodiment, a dye may also be added to the resist compositions. The dye may be useful for modifying the properties of the resist, or may be useful as an energy transfer means. Dyes may include, without limitation, 9-anthracenemethanol, 9-phenoxymethylanthracene, 9,10-diphenylanthracene, substituted phenanthrenes and substituted biphenyls, 4-phenylazoresorcicrystal dyes related thereto, crystal violet base, and dyes selected from the coumarin class of dyes.

In yet another alternative embodiment, a residual acid scavenger may be added to the resist compositions. Examples of residual acid scavengers include tetraalkylammonium hydroxides, tetraalkanol ammonium hydroxides, dimethylaminopyridines, and ethylene oxide/propylene oxide block copolymer surfactants.

Additional uses and embodiments of the present invention will become apparent to the skilled artisan upon reading the following detailed examples.

EXAMPLE 1

Synthesis of poly(p-hydroxystyrene-co-p-(2-(2-methoxy)-propyloxy)styrene (PHMOP)

250 g of polyhydroxystyrene (available from Hoechst, 8,100 Mw) was heated at 60° C. in vacuum oven overnight to remove water. It was then dissolved in 750 ml of anhydrous tetrahydrofuran (THF) in a 2 liter round bottom flask, and the flask and contents were immersed into a dry ice/acetone bath. 46.46 g (0.3 equivalents based on polyhydroxystyrene) of methoxypropene was added to the solution with stirring. After mixing, 53 mg of p-toluene sulfonic acid was added. The reaction was allowed to continue at reduced temperature for one hour, then the bath was removed and the reaction was continued for another one hour at room temperature. To quench the reaction, 30 ml of concentrated ammonium hydroxide solution was added to the polymer solution. The solid polymer product was precipitated by dripping the polymer solution into water containing ammonium hydroxide (16 ml in 3000 ml water). After filtration and washing with water (or alternatively, water containing ammonium hydroxide solution), the solid was dried under nitrogen and suction for 2 to 3 hours. Finally, the polymer solid was dried in vacuum overnight at room temperature. The polymer was then analyzed with NMR, IR and TGA. The data obtained are summarized below:

TABLE 1

Summary of NMR & TGA data from different lots:

| Lot | { <-- NMR --> } | | | TGA |
|---|---|---|---|---|
| | THF/PHS | MOP/PHS | (THF + MOP)/PHS | (THF + MOP)/PHS |
| #1 | 13.4 | 21.8 | 35.2 | 33.9 |
| #2 | 16.2 | 21.5 | 37.8 | 39.1 |
| #3 | 16.8 | 16.7 | 33.5 | 30 |
| #4 | 7.5 | 15.8 | 23.3 | 28.5 |
| #5 | 10.1 | 14.0 | 24.1 | 26.5 |

Infrared spectra of all the lots have two absorption peaks at 1068 and 1134 cm−1 which are the characteristics of ketal functionality on the polymer. The peak heights are proportional to the MOP/PHS ratio. In the synthesis of lot #3, the polyhydroxystyrene used was only 60 g and the sample was dried under a nitrogen stream at 70° to 80° C. overnight before reaction. Both lot #3 and #5 used HPLC grade THF instead of anhydrous THF from Aldrich. In lot #4, the methoxy propene was from Jansen (92% pure) and was purified through vacuum distillation. The weight of methoxy propene used in lot #4 was 45.06 g. In lot#3 and #5, the molecular weight of the PHOST is 8,600.

EXAMPLE 2

Synthesis of PHMOP having Differing Degrees of Substitution

Using the synthetic procedure of example 1, the amount of methoxypropene was varied to obtain PHMOP having varying degrees of substitution. The results are shown in Table 2 below:

TABLE 2

Summary of NMR & TGA data from different lots:

| Lot Reactant | (Molar %) | { -- NMR -- } | | | TGA |
|---|---|---|---|---|---|
| | | THF/ PHS | MOP/ PHS | (THF + MOP)/ PHS | (THF + MOP)/ PHS |
| #6 | 35% | 13.3 | 19.3 | 32.6 | 35 |
| #7 | 40% | 12.9 | 23.4 | 36.3 | 40 |
| #8 | 50% | 14.3 | 27.4 | 41.7 | 50 |

The reaction of lot #6 and #7 is similar to that of #4 in example 1 and the reaction of #8 is similar to that of #3. In lot #8 the molecular weight of the PHOST is 8,600.

EXAMPLE 3

Synthesis of PHMOP with Higher Molecular Weight PHOST at Room Temperature 24 g of PHOST (Hoechst, 11,000 Mw) in 150 ml of THF was stirred until the solid polymer was completely dissolved, and then a large quantity of anhydrous sodium sulfate was added to remove water. The mixture was stirred for two hours, then 5 g of 2-methoxypropene was then added to the mixture. After stirring for a few minutes, 100 mg of p-toluene sulfonic acid was added and the reaction continued for one hour. The reaction was quenched with 1 ml of N-methylmorpholine. The mixture was filtered through a celite filter bed to remove sodium sulfate. The solid polymer was precipitated by dripping the filtered solution into water containing ammonium hydroxide (5 ml concentrated ammonium hydroxide in 1600 ml of water). The solid was filtered and dried under vacuum.

EXAMPLE 4

Synthesis of PHMOP from Maruzen PHOST 10.2 g of PHOST (available from Maruzen, containing 10% of vinyl cyclohexanol copolymer) was dissolved in approximately 40 ml of THF containing solid anhydrous sodium sulfate. The procedure of Example 3, except with 4 g 2-methoxypropene, and 30 mg p-toluene sulfonic acid monohydrate was used. The reaction was quenched with 3 ml of concentrated ammonium hydroxide. The final weight of the product was 11.8 g.

EXAMPLE 5

Synthesis of PRMOP in Ethyl Acetate Using Ion Exchange Resin 36 g of PHOST (Hoechst, 8,600 Mw) in 180 ml of ethyl acetate was stirred until the solid polymer was completely dissolved, and then 11.2 g of 2-methoxypropene was added to the solution. After stirring for a few minutes, 750 mg of Amberlyst 15 acidic ion exchange resin was added and the reaction was continued for one hour. The resin was then filtered out with a 0.2 μm filter. The filtered solution was dried using rotary evaporation to give 43 g of a solid polymer product.

A resist was formulated with 3% triphenylsulfonium triflate (TPS), 0.24% tetrabutylammonium hydroxide (TBAH), and the polymer synthesized above dissolved in PMA to give a total solid content of 20%. The resist was coated on a HMDS primed silicon wafer and baked at 100 deg C. for 120 sec on a hot plate. The resist had a film thickness of about 8.53 KÅ. The coated wafer was exposed to a DUV radiation through a chrome mask on Canon 0.37NA Excimer Laser Stepper at 248 nm and received a dose of 8.5 Mj/cm$^2$. The exposed wafer is then developed in 0.154N aqueous TMAH for 75 seconds. The resist yielded 0.50 μm positive tone images. The film thickness loss was only 360 Å.

EXAMPLE 6

Synthesis of PHMOP at Room Temperature 20 g (0.165M) poly(4-hydroxystyrene) (Hoechst, 8,200 Mw) was dissolved in 75 ml of anhydrous THF. 5–6 mg of p-toluene sulfonic acid was added as catalyst. After 4.79 g (0.066M) of 2-methoxypropene was added in one portion, the reaction mixture was stirred at room temperature for 3 hours. 2.6 mg of ammonium hydroxide was then added to neutralize the acid catalyst. The solution was then added dropwise to 800 ml of deionized water to precipitate the polymer. The polymer was filtered, washed several times with deionized water and dried in a vacuum oven. The NMR data of the polymer showed MOP/PHS=17.3 and THF/PHS=16.4.

A resist was formulated with 0.7% TPS and 0.14% TBAH in the polymer synthesized above, and dissolved in PMA to give a total solid content of 20%. The resist was coated on a HMDS primed silicon wafer and baked at 100 deg C. for 120 sec on a hot plate. The resist had a film thickness of about 1.2 μm. The coated wafer was exposed to a DUV radiation through a chrome mask on Canon 0.37NA Excimer Laser Stepper at 248 nm and received a dose of 36 mJ/cm$^2$. The exposed wafer is then developed in 0.14N aqueous TMAH for 120 seconds. 0.50 μm positive images with vertical profiles were obtained.

EXAMPLE 7

Synthesis of PHMOP using HCl 20 g (0.165M) of poly(4-hydroxystyrene) (Hoechst, 8,200 Mw) was dissolved in 75 ml of anhydrous THF. The solution was cooled in an ice bath to 0° C. Two drops of concentrated HCl was added to the solution. After 4.79 g (0.066M) of 2-methoxypropene was added, the mixture was stirred at 0° C. for one hour followed by one hour at room temperature. Ammonium hydroxide (2.6 ml) was added to neutralize the acid and the resulting solution was added dropwise to 800 ml of deionized water to precipitate the polymer. The polymer was filtered and washed thoroughly with deionized water and dried in a vacuum oven. The NMR data of the polymer showed MOP/PHS=8.9 and THF/PHS=25.8.

A resist was formulated with 0.7% TPS and 0.14% TBAH in the polymer synthesized above and dissolved in PMA to give a total solid content of 20%. The resist was coated on a HMDS primed silicon wafer and baked at 100 deg C. for 120 sec on a hot plate. The resist had a film thickness 1.12 μm. The coated wafer was exposed to a DUV radiation through a chrome mask on Canon 0.37NA Excimer Laser Stepper at 248 nm and received a dose of 30 mJ/cm$^2$. The exposed wafer was then developed in aqueous tetramethyl ammonium hydroxide (0.15N TMAH) for 60 seconds. Reasonable images were resolved with film thickness loss of 0.14 μm.

EXAMPLE 8

Synthesis of PHMOP with Excess 2-methoxypropene 20 g (0.165M) poly(4-hydroxystyrene) (Hoechst, 8,200 Mw) was dissolved in 75 ml of anhydrous THF. 5–6 mg of p-toluene sulfonic acid was added as a catalyst. After the solution was cooled in an ice bath, 13 g (0.18M) of 2-methoxypropene was added and the solution was stirred at 0° C. for one hour and at room temperature for one hour. The reaction was quenched with 2.6 ml of ammonium hydroxide. The solution was added dropwise to 800 ml of deionized water and the precipitated polymer was filtered, washed thoroughly with deionized water and dried in vacuo. The NMR data of the polymer showed MOP/PHS=49.6 and THF/PHS=12.9.

15

A resist was formulated with 0.7% TPS and 0.14% TBAH in the polymer synthesized above, and dissolved in PMA to give a total solid content of 20%. The resist was coated on a HMDS primed silicon wafer and baked at 100 deg C. for 120 sec on a hot plate. The coated wafer was exposed to a DUV radiation through a chrome mask on Canon 0.37NA Excimer Laser Stepper at 248 nm and received a dose of 34 mJ/cm$^2$. The exposed wafer was then developed in aqueous tetramethyl ammonium hydroxide (0.14N TMAH) for 80 seconds to obtain 0.35 μm positive images.

EXAMPLE 9

Synthesis of Methoxypropyl Substituted Poly(4-hydroxybenzylsilsesquioxane)

4 g (0.025M) of poly(4-hydroxybenzylsilsesquioxane) was dissolved in 50 ml of ethyl acetate and cooled in an ice bath. After 0.15 g of Amberlyst-15 ion exchange resin was added to the solution, 1 g (0.014M) of 2-methoxypropene was added and the solution was stirred at 0° C. for one hour and at room temperature for 30 minutes. The solution was filtered and the solvent was removed by rotary evaporation. The residue was dried in a vacuum oven.

A resist was formulated with 2% TPS and the methoxypropyl protected poly(4-hydroxybenzylsilsesquioxane) as synthesized above in PMA to give a total solid content of 20%. The resist was coated on hardbaked novolak underlayer and exposed to Deep-UV radiation On Canon 0.37NA Excimer Laser Stepper at 248 nm. Images down to 0.4 μm had been resolved at 25–30 mJ/cm$^2$.

EXAMPLE 10

Synthesis of 4,5-dihydro-2-methylfuran Substituted Polyhydroxystyrene 24 g of polyhydroxystyrene (8,600 M.W.) was heated to about 80° C. in a round bottom flask under a nitrogen stream overnight to remove residual water from the polymer. The dried sample was then dissolved in approximately 70–80 ml of THF. 8.8 g of 4,5-dihydro-2-methylfuran was then added to the solution. The solution was stirred vigorously for a few minutes, then about 45 mg of p-toluenesulfonic acid monohydrate was added. The solution started to warm, and was then emerged into a water bath. The reaction was allowed to continue for 100 minutes, then quenched with 4 ml of concentrated ammonium hydroxide. The polymer was allowed to precipitate out of the dilute ammonium hydroxide-water solution. The polymer was filtered, washed and then dried under vacuum for more than 18 hours. The final weight of the polymer was approximately 33 g. The IR spectrum of above synthesized polymer shows two new peaks between 1000 cm-1 and 1150 cm-1, which indicates the existence of ketal protecting group on the polymer.

A resist formulation was obtained with the following compositions: 0.18% tetrabutylammonium hydroxide, 1.5% triphenyl sulfonium triflate and the 4,5-dihydro-2-methylfuran substituted polymer described above to make up 22% solids in PMA. It was spin coated on silicon wafer to give a thickness around 10.6 KÅ. It was then exposed at Oriel tool with around 30 mj. After developing in 0.1N TMAH for 40 s, the image was cleared out with no significant thinning. Another wafer with resist thickness around 9.38 KÅ was exposed in the excimer laser system at 25 mJ and developed in 0.105N TMAH (diluted from MF321). The final thickness was 8.11 KÅ. The image was cleared out. All the above experiments were carried out without post exposure bake. The resist always generated latent image right after exposure which indicates that the rate of chemical amplification is very high.

16

EXAMPLE 11

Synthesis of Methoxypropyl Protected Novolak Polymer

The synthetic procedure was the same as example 1. In the reaction, the amount of meta-cresol novolak was 60 g, the amount of THF used was 200 ml, the amount of 2-methoxypropene was 72 g, and the amount of p-toluene sulfonic acid was 12.7 mg. The reaction was carried out at –78° C. for one hour followed by one and half hour at room temperature. It was then quenched with 10 ml of concentrated ammonium hydroxide and worked out the same way as example 1. The final dried sample shows nearly 100% protection on all the hydroxyl group of the novolak polymer according to the NMR data.

A resist formulation was obtained with the following compositions: 0.14% TBAH, 0.7% triphenyl sulfonium triflate and methoxypropyl substituted novolak as synthesized above, to make up 20% solids in PMA. It was spin coated on silicon wafer baked at 100° for 60 s to give a thickness around 4.4 K Å. It was then exposed on an Oriel tool at about 80 mJ. A sharp latent image developed right after exposure. It was post exposure baked at 80° C. for 60 s. After developing in 0.54N TMAH for 5 minutes, the image was cleared out with no resist thinning at all. When the resist was exposed with 20 mj, the develop time needed was much longer than 5 minutes. There was also no film thickness loss in this experiment.

EXAMPLE 12

Synthesis of Methoxypropyl Substituted 6F-bisphenol A 3.36 g (0.01M) of 6F-bisphenol A was dissolved in 25 ml of anhydrous THF and the mixture was cooled to 0° C. in an ice bath. After 0.15 g of Amberlyst-15 was added as a catalyst, 2.5 g (0.035M) of 2-methoxypropene was added, and the mixture was stirred for one hour at 0° C. and 30 minutes at room temperature. The solution was then filtered to remove the ion exchange resin and the solvent was removed by rotary evaporation. The sticky solid was dried thoroughly under vacuum.

EXAMPLE 3

Synthesis of Methoxypropyl Substituted 1,1,1-tris(4-hydroxyphenyl)ethane 3.06 g (0.01M) of 1,1,1-tris(4-hydroxyphenyl)ethane was dissolved in 50 ml of ethyl acetate and cooled in an ice bath. 0.1 g of Amberlyst-15 and 4.0 g (0.05M) of 2-methoxypropene were added, and the mixture was stirred at 0° C. for one hour and at room temperature for 30 minutes. The solution was filtered to remove the ion exchange resin and the solvent was removed by rotary evaporation. The viscous residue was dried thoroughly under vacuum.

EXAMPLE 14

Synthesis of Polymer Bound Diazoacetoacetate

The above polymer was synthesized by the following two step process.

(a). 12.1 g (0.1M) Poly(4-hydroxystyrene) was dissolved in a cyclopentanone/toluene (40 ml/20 ml) solvent mixture. 14.2 g (0.09M) t-Butyl acetoacetate was added dropwise over 5 minutes and the mixture was then refluxed overnight. The solvent mixture, along with the t-butyl alcohol generated by the transesterification reaction, was removed by distillation under vacuum and the residue was precipitated into water, filtered and dried to give the acetoacetylated polymer.

(b). 12 g of the acetoacetylated polymer from step (a) was dissolved in 20 ml acetonitrile and cooled in an ice bath. 6 g Triethylamine was added, followed by 12 g p-toluenesulfonyl azide, and the mixture was stirred at 0° C. for 1 hour and at room temperature for 3 hours. The solvent was then removed by rotary evaporation. The residue was redissolved in acetone and precipitated into deionized water containing approximately 5% KOH. The precipitate was filtered, washed several times with water and dried to yield the polymer bound diazoacetoacetate.

EXAMPLE 15

Lithographic Dose Vs. Photo Acid Generator Loading

Three sets of resists were formulated with PHMOP (synthesized in Example 4), triphenyl sulfonium triflate (TPS) and tetrabutylammonium hydroxide(TBA H). The solvent used was propylene glycol methyl ether acetate. The compositions are as below:

TABLE 3

| resist No. | solid content | TPS | TBAH |
| --- | --- | --- | --- |
| a1 | 22% | 3% | 0.9% |
| a2 | 22% | 1.5% | 0.45% |
| a3 | 22% | 1% | 0.15% |

The above resists were coated on HMDS treated Si wafers by spin coating at a spin speed of 3000 rpm. The thickness of the resist films were around 10.30 KÅ after post apply bake at 90° C. for 5 minutes. The coated wafers were exposed to DUV radiation through a chrome mask on a Canon 0.37NA Excimer Laser Stepper at 248 nm, and then all developed with 0.18N tetramethyl ammonium hydroxide (TMAH) developer for 90 s. No post exposure bake was introduced in this experiment. The film thickness loss after this develop process was around 300 Å. The nominal dose for both resist a1 and a2 was the same (around 32 mJ) to resolve 0.5 and 0.45 µm images. However, with less TBAH/TPS ratio, resist a3 had a nominal dose around 23 mJ.

EXAMPLE 16

Resist sensitivity as a function of MOP protection

Four sets of resists were formulated with the PHMOP synthesized in Example 1 & 2 or with similar procedures.

TABLE 4

| Resist No. | MOP/PHS | Litho. Dose | % TPS | % TBAH |
| --- | --- | --- | --- | --- |
| b1 | 27.4 | 14 mj | 1.0 | .17 |
| b2 | 23.4 | 16 mj | 0.7 | 0.14 |
| b3 | 19.3 | 17 mj | 0.75 | 0.15 |
| b4 | 10.5 | 18 mj | 0.8 | 0.2 |

The processes used for these resists were very similar to Example 15. The solid contents were around 20%. The post apply bake was 95 C. for 2 min. and the develop condition was 0.15N TMAH for 60 s. For b1 the developer concentration was 0.21N. The lithographic doses used above were obtained from the doses which yielded images with the nominal linewidth of 0.45 µm.

EXAMPLE 17

Resist using MDT as Photoacid Generator

A resist was formulated with 2.5% butylated hydroxytoluene and 10% MDT in PHMOP (synthesized in Example 3), and dissolved in PMA to give a total solid content of 20%. The resist was coated on HMDS treated Si wafer and exposed to a DUV radiation through a chrome mask on a Canon 0.37NA Excimer Laser Stepper at 248 nm. The resist gave 0.4 µm positive images with vertical sidewalls at a dose of 9 mj after developing with 0.14N TMAH for 45 s. The film thickness loss during development was less than 400 Å.

EXAMPLE 18

Resist using 1,2,3,-tris(4-Fluorobenzenesulfonyloxy)benzene (FBS) as Photoacid Generator A resist was formulated with 5% FBS and 0.2% TBAH in PHMOP (synthesized similar to that of lot #3 in Example 1) and dissolved in PMA to give a total solid content of 20%. The resist was coated on HMDS treated Si wafer and exposed to DUV radiation through a chrome mask on a Canon 0.37NA Excimer Laser Stepper at 248 nm. The resist gave 0.45 µm positive images with vertical sidewalls at a dose of 64 mj after development with 0.18N for 70 s., The film lost during this process was less than 400 Å. When the FBS loading and development time were changed to 10% and 60 s respectively, the resist gave 0.40 µm positive images with vertical sidewalls at a dose of 56 mj.

EXAMPLE 19

Deep-UV Lithography of Resist using Benzenesulfonyl Benzoyldiazomethane (BSPDM) as Photoacid Generator A resist was formulated with 2% BSPDM and 0.25% TBAH in PHMOP (lot #7 in Example 2) and dissolved in PMA to give a total solid content of 20%. The resist was coated on HMDS treated Si wafer and exposed to a DUV radiation through a chrome mask on a Canon 0.37NA Excimer Laser Stepper at 248 nm. The resist gave 0.40 µm positive images with nearly vertical sidewalls at a dose of 36mj after development with 0.15N for 90 s.

EXAMPLE 20

N-methyl Pyrrolidinone Contamination Test

A resist formulated as in Example 18 was coated and exposed to saturated N-methyl pyrrolidinone (NMP) vapor for 255 s and was processed as in example 18. No linewidth change on the resolved images was observed compared with those of the wafer without NMP exposure. No T-top was found on the resolved images. At the same time, a resist of t-butylcarbonate functionalized system was exposed to the same NMP vapor pressure for 45 s. The resist images showed T-tops with significant change in linewidth and were not fully developed. Another formulation with 0.7% TPS and 0.14% TBA H in the same PHMOP (as Example 18) polymer matrix showed the same resilience to NMP; no change in image size after 255 s NMP exposure.

EXAMPLE 21

Lithography of Lot #6 in Example 2

A resist was formulated with 0.75% TPS and 0.15% TBAH in PHMOP (synthesized in Example 2 lot #6) and dissolved in PMA to give a total solid content of 20%. The resist was coated on several HMDS primed silicon wafers and baked at 100 deg C. for 120 s on a hot plate. One coated wafer was exposed to DUV radiation through a chrome mask on a Canon 0.37NA Excimer Laser Stepper at 248 nm and received a dose of 18 mJ/cm$^2$. The exposed wafer is then developed in 0.15N aqueous TMAH for 60 seconds which provided 0.4 μm positive images with nearly vertical sidewalls.

EXAMPLE 22

Process with Post Exposure Bake

A coated wafer from example 21 was exposed to DUV radiation, receiving a 16 mJ/cm$^2$ dose followed by a PEB at 90° C. for 90 sec. and development in 0.15N TMAH for 60 seconds. 0.35 μm positive images were obtained having nearly vertical sidewalls.

EXAMPLE 3

Linewidth Stability with Long Expose-Develop Delay

Another one of the exposed wafers of example 21 was stored under ambient condition for 24 hours before development in TMAH for 60 seconds. 0.4 μm positive images with linewidth within 10% of that from example 21 were produced.

EXAMPLE 24

Linewidth Stability with Long Expose-PEB Delay

Another one of the exposed wafers of example 21 was stored under ambient environment for 24 hours before a 90 seconds PEB at 90° C. and development in TMAH for 60 seconds. 0.35 μm positive images having near vertical sidewalls were produced. The linewidth measurements of images were within 10% of that obtained in example 22.

EXAMPLE 25

Effect of Different Post Exposure Bake Temperature on the Linewidth of Resist Image A resist formulation was obtained with the following compositions: 0.15% TBAH, 0.75% TPS and PHMOP (as synthesized in Example 2 lot #6) to make up 20% solid in PMA. The resist was coated on HMDS primed Silicon wafers and baked at 100 deg C. for 120 s on a hot plate. The coated wafers were exposed to a DUV radiation through a chrome mask on a Canon 0.37NA Excimer Laser Stepper at 248 nm and received a dose of 18 mJ/cm$^2$. Except for one wafer which was not subjected to any heat treatment, the rest of exposed wafers were subjected to a series of different baking temperatures respectively for 90 s without any PEB delay. The exposed wafers were then developed in aqueous 0.15N TMAH for 60 seconds right after PEB. The linewidth for 0.4 μm resist images measured for each wafer at each temperature are summarized as below: 0.39 μm for no bake, 0.36 μm for 50° C. PEB, 0.38 μm for 60° C., 0.37 μm for 70° C., 0.38 μm for 80° C., 0.39 μm for 90° and 0.38 μm for 102° C. respectively. It was found that some extra resist thinning occurred if the PEB applied to the resist was above 100° C.

EXAMPLE 26

Polymer Bound Diazoacetoacetate (DZA) as a Photo-Carboxylic Acid Generator in Deep-UV Lithography A resist was formulated with 16–18% of the acid generator DZA (based on total solids) and PHMOP in PMA to give a total solids content of 20%. The resist was coated on HMDS treated Si wafer and exposed to DUV radiation through a chrome mask on a Canon 0.37NA Excimer Laser Stepper at 248 nm. The resist had a sensitivity of 16–20 mJ/cm$^2$ and has a linear resolution down to 0.4 μm lines and spaces. The post exposure bake was 80° C. for 90 s and the developer was 0.14N TMAH. The 2 component resist was stable to NMP up to 5 minutes, without any deterioration to profiles and had a shelf life in solution of at least 2 months at room temperature.

EXAMPLE 27

Sensitivity as a Function of MOP Protection During E-beam Exposure

Resist was made by mixing PHMOP of examples 1 & 2 with 0.7% TPS and 0.14% TBAH in PMA to yield 20% solid content solution. The resists were spin coated on HMDS primed wafers. The coated film then was baked on a hot plate at 110° C. for 3 min. The exposure was performed on a 50 Kev e-beam exposure tool (Hontas tool). The wafers then were stored in a nitrogen box for at least half an hour before developing in 0.14N TMAH aqueous developer for 50 sec. Contrast curves were constructed for each resist and the images were examined with an SEM. All resists were capable of resolving line and space pairs down to 0.20 μm with reasonably vertical profiles. The resist sensitivity to first order is not affected by the MOP protection as much as by the variation in acid generator and stabilizing base loadings. However, the effect of MOP protection was evident from the film thickness loss during development; the lower the MOP protection the higher film thickness loss.

EXAMPLE 28

Sensitivity as a Function of TPS and TBAH Loadings During E-beam Exposure

Resist was made by mixing lot #5 of example 1 with different loadings of TPS and TBAH in PMA. The resists were spun coated on HMDS primed Si wafers. A PAB of 110° C. for 3 min was carried out before exposure to e-beam from a 50 KV Hontas tool. The wafers were developed in 0.14N TMAH for 50 sec after at least half an hour delay. The resist sensitivity is significantly affected by the base loading and residual methanol from it; increased amount of base or methanol leads to decrease in resist sensitivity. The effect of TPS loading when combined with the base is less significant when compared to TPS without base. Furthermore, this example shows the extreme sensitivity of the resist to trace amounts of acid.

EXAMPLE 29

Resist Shelf Life

The extreme sensitivity observed in Example 1 and 2 of the resist formulation to small amounts of acid raised a question about the resist's shelf life. Two approaches have been used to stabilize the resist and extend its shelf life. The first is by adding a base to the resist and the second is by purifying the solvent and minimizing its residual acid content. Both approaches showed an improvement in shelf life. However, more gain in shelf life was attained by purifying the solvent. The shelf life was examined by aging the resist material in a constant temperature bath at 40 C. Both the resist dissolution rate in 0.21N TMAH and its sensitivity were monitored as a function of time in the bath. The effect of aging manifested itself by changing the dissolution rate which is correlated to MOP deprotection. The resist sensitivity is slightly affected by the aging process.

EXAMPLE 30

I-line Lithography

Chemical amplification with carboxylic acid generated from diazonaphthoquinone system.

A resist containing PHMOP synthesized in Example 3 and 10 Wt. % of p-creol ester of 2-diazo-1-naphthalene-4-sulfonic acid was formulated in propylene glycol methyl ether acetate with the solid content at 20%. The resist was spin coated at 3000 rpm on an HMDS treated Si wafer and post apply baked at 90° C. for 5 minutes. After exposure to 365 nm radiation with a GCA stepper (0.35 NA) for 0.5 s (approximately 50 mj), the resist was baked at 88° C. for 90 s and developed with 0.15N TMAH for 60 s. An image resolution down to 0.6 μm was obtained. It appeared to exhibit no or very little chemical amplification when T-butyl carbonate protected polyhydroxystyrene with this DQ compound was used, which is evident from the lack of a sharp latent image after post exposure bake and the failure to resolve small image even at much higher dose.

EXAMPLE 31

I-line Lithography using 2-methoxypropyl Protected Compounds in a Three Component System The photoresist solution for I-line exposure (365 nm) was formulated from 4 parts by weight of one of the 2-methoxy propyl protected compounds synthesized in Examples 12 & 13, 2 parts by weight of the photoacid generator, 14 parts by weight of novolak resin and 80 parts by weight of the solvent propylene glycol monomethyl ether acetate. This solution was spun coated to a thickness of 1.08 μm on silicon wafers and post apply baked at 90° C. for 90 s. The resist was then patterned by the exposure at 0.8–1.0 s on GCA (0.35NA) stepper and post exposure baked at 100°–110° C. for 60 s followed by the development in 0.263N TMAH.

EXAMPLE 32

X-ray Lithography

A resist was formulated with 1% TPS and 0.2% TBAH in PHMOP (Example 1 lot #3) and dissolved in PMA to give a total solid content of 20%. The resist was spin coated on HMDS primed Si wafer and received a PAB at 100° C. for 2 minutes. Exposure was carried out on a RDY stepper attached to an Oxford Synchrotron radiation compact ring located at the IBM EF facility. The dose was varied by changing the scan speed to generate a contrast curve. The wafers were developed in 0.15N TMAH for 60 seconds. The resist exhibited a reasonable contrast and a dose to clear of about 100 mj. Further process development may be required to optimize resist contrast and image control, nevertheless this example demonstrates feasibility of using this resist for X-ray lithography.

EXAMPLE 33

Contrast Quality of the Crosslinked Polymeric Resin

The following Table illustrates how the quality of contrast improves with increased polymer (PHOST or PHS) crosslinking as measured by gel permeation chromatography (GPC). In addition, as indicated by IR analysis, relative contrast improves with increased O-substitution with the methoxypropene (MOP). The relative MOP/PHS percentage, which corresponds to the degree of MOP substitution on the polyhydroxystyrene (PHS) polymer and provided by NMR data, should be at least about 25% for improved contrast. Syntheses of the samples analyzed can be found in the above Examples 1, 2, and 8, and additional analytical information may be found in Tables 1 and 2 above.

TABLE 5

| SAMPLE | MW (K) | MOP/PHS (%) | GPC AREA % CROSS-LINKED | RELATIVE MOP BY IR | RELATIVE CONTRAST |
|---|---|---|---|---|---|
| Example 1: Lot #4 | 23 | 15.8 | 19.6 | 0.219 | Very poor |
| Example 2: Lot #7 | 25 | 23.4 | 21.5 | 0.358 | Very poor |
| Example 1: Lot #2 | 30.0 | 21.5 | 30.5 | 0.406 | Poor |
| Example 1: Lot #1 | 31.0 | 21.8 | 32.6 | 0.305 | Poor |
| Example 8 | 35 | 49.6 | 36.4 | 0.687 | Good |
| Example 2: Lot #8 | 51 | 27.4 | 48.0 | 0.606 | Good |

Upon a reading of the present disclosure, it will be apparent to the skilled artisan that other embodiments of the present invention beyond those embodiments specifically described herein may be made or practiced without departing from the spirit of the invention. Similarly, changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A crosslinked aqueous base developable microlithographic resist composition comprising in admixture:
   (a) an acid labile compound comprising a ketal moiety;
   (b) a crosslinked resin comprising a film forming polymer having recurrent hydroxyl groups chemically bonded thereto, wherein at least a portion of said recurrent hydroxyl groups are O-substituted by ketal exchange with said acid labile compound and wherein said film forming polymer is crosslinked through at least a portion of said acid labile compound substituents to form said crosslinked resin wherein said crosslinked resin comprises about 33% or above of said film forming polymer; and
   (c) an acid generating compound which forms an acid upon exposure to actinic radiation, wherein said acid generated upon exposure causes the cleavage of at least a portion of said acid labile compound from said O-substituted hydroxyl groups and causes the cleavage of at least a portion of said resin crosslinks, and wherein the exposed composition is rendered selectively more soluble in aqueous base and has a lower molecular weight compared with the unexposed composition.

2. The composition of claim 1, said composition further comprising a residual acid scavenger.

3. The composition of claim 1, wherein the degree of O-substitution is between about 15% to about 50%.

4. The composition of claim 1, wherein said crosslinked resin is thermally stable at a temperature of about 120° C.

5. The composition of claim 1, wherein said ketal moiety of said acid labile compound comprises 2-(2-methoxypropyl)oxy.

6. The composition of claim 5, wherein said acid labile compound comprises methoxypropene.

7. The composition of claim 1, wherein said recurrent hydroxyl groups are phenolic.

8. The composition of claim 7, wherein said film forming polymer comprises polyhydroxystyrene.

* * * * *